(12) United States Patent
Huang (10) Patent No.: US 7,116,535 B2
(45) Date of Patent: Oct. 3, 2006

(54) METHODS AND APPARATUS FOR PROTECTING AN MR IMAGING SYSTEM

(75) Inventor: Jinhua Huang, Florence, SC (US)

(73) Assignee: General Electric Company, Schenectady, NY (US)

( * ) Notice: Subject to any disclaimer, the term of this patent is extended or adjusted under 35 U.S.C. 154(b) by 124 days.

(21) Appl. No.: 10/826,643

(22) Filed: Apr. 16, 2004

(65) Prior Publication Data

US 2005/0231859 A1 Oct. 20, 2005

(51) Int. Cl.
*H02H 7/00* (2006.01)

(52) U.S. Cl. .................................................. 361/19
(58) Field of Classification Search ............... 361/19
See application file for complete search history.

(56) References Cited

U.S. PATENT DOCUMENTS

| | | | |
|---|---|---|---|
| 4,689,707 A | 8/1987 | Schwall | |
| 4,926,289 A | 5/1990 | Reichert | |
| 5,029,287 A | 7/1991 | Dessalles-Martin et al. | |
| 5,210,512 A | 5/1993 | Davies | |
| 5,278,380 A | 1/1994 | Lowry | |
| 5,329,266 A | 7/1994 | Soeldner et al. | |
| 5,426,366 A | 6/1995 | Overweg et al. | |
| 5,523,914 A | 6/1996 | Weck et al. | |
| 5,644,233 A | 7/1997 | Bird et al. | |
| 5,650,903 A | 7/1997 | Gross et al. | |
| 5,731,939 A | 3/1998 | Gross et al. | |
| 5,739,997 A | 4/1998 | Gross | |
| 5,952,269 A | 9/1999 | Ma et al. | |
| 6,147,844 A * | 11/2000 | Huang et al. | 361/19 |
| 6,169,399 B1 | 1/2001 | Zhang et al. | |
| 6,307,370 B1 | 10/2001 | Schauwecker et al. | |
| 6,369,464 B1 | 4/2002 | Schauwecker et al. | |
| 6,476,700 B1 | 11/2002 | Schauwecker et al. | |
| 6,717,781 B1 * | 4/2004 | Xu et al. | 361/19 |
| 2004/0027737 A1 * | 2/2004 | Xu et al. | 361/19 |
| 2004/0263165 A1 * | 12/2004 | Shen et al. | 324/309 |

FOREIGN PATENT DOCUMENTS

| | | |
|---|---|---|
| EP | 0489291 A3 | 6/1992 |
| EP | 0758811 A3 | 2/1997 |

OTHER PUBLICATIONS

English Translation of a portion of Japanese Patent JP04125021 A2, Apr. 24, 1992.
Great Britain Search Report, Feb. 9, 2006, 1 pg.
Great Britain Search Report, Sep. 26, 2005, 1 pg.
R.E. Schwall, Protection System For Inductively Coupled Magnets, Transactions On Magnetics, V. 27, No. 2, Mar. 1991, pp. 1700-1703.

* cited by examiner

*Primary Examiner*—Ronald Leja
(74) *Attorney, Agent, or Firm*—Carl B. Horton, Esq.; Armstrong Teasdale LLP (57) ABSTRACT

A method of protecting an MR imaging system including a plurality of coil groups includes connecting at least one first diode between terminals of a first coil group, connecting at least one second diode between terminals of a second coil group, wherein the second group is connected to the first coil group via a separation line, and connecting at least one quench heater between the separation line and the first and second diodes.

25 Claims, 4 Drawing Sheets

METHODS AND APPARATUS FOR PROTECTING AN MR IMAGING SYSTEM

BACKGROUND OF THE INVENTION

This invention relates to Magnetic Resonance Imaging (MRI) systems. More particularly, this invention relates to a quench protection circuit.

As is known, a coil wound of superconductive material (a magnet coil) can be made superconducting by placing it in an extremely cold environment. For example, a coil may be made superconducting by enclosing it in a cryostat or pressure vessel containing a cryogen. The extreme cold enables the superconducting wires to be operated in a superconducting state. In this state, the resistance of the wires is practically zero. To introduce a current flow through the coils, a power source is initially connected to the coils for a short time period. In the superconducting state, the current will continue to flow through the coils, thereby maintaining a strong magnetic field. In other words, because superconductive windings offer no resistance to electrical current flow at low temperatures, the superconducting magnet is persistent. The electric current that flows through the magnet is maintained within the magnet and does not decay noticeably with time. Superconducting magnets have wide applications in the field of magnetic resonance imaging ("MRI").

In a typical MRI magnet, the main superconducting magnet coils are enclosed in a cylindrically shaped cryogen pressure vessel. The cryogen vessel is contained within an evacuated vessel and formed with an imaging bore in the center. The main magnet coils develop a strong magnetic field in the imaging volume of the axial bore.

A common cryogen is liquid helium. During superconducting operation, liquid helium boils to form helium gas. The gas is either recondensed for recycling and reuse or is vented to the atmosphere.

One concern in such apparatuses is the discontinuance of superconducting operation (i.e., "quenching"). Quenching can produce undesirable and possibly damaging high temperatures and voltages within the magnet. During a quench event, the current in the persistent superconducting coils decays rapidly. The rapid decay is as a result of resistive zone(s) developed in the coils for example due to thermal or mechanical disturbance. Quenching may occur from an energy disturbance, such as from a magnet coil frictional movement. The energy disturbance heats a section of superconducting wire, raising its temperature above the critical temperature of superconducting operation. The heated section of wire becomes normal (i.e., non-superconducting) with some electrical resistance. The resulting $I^2R$ Joule heating further raises the temperature of the non-superconductive section of wire increasing the size of the non-superconductive section. An irreversible action called quench then occurs. During a quench, the electromagnetic energy of the magnet is quickly dumped or converted into thermal energy through the increased Joule heating.

For MRI applications, a homogeneous magnetic field is desired in the imaging volume. To provide the desired homogeneity, the magnet coil is divided into a plurality of coils. These coils are spaced along and around the axis of the superconducting magnet such that they are not thermally connected. As a result, when only one of the superconducting coils quenches, the entire energy of the strong magnetic field may be dumped into the quenching coil. A hot spot and possible damage is caused unless a suitable quench protection system is provided. Quench protection can be accomplished by quickly quenching the other coils. Damage from a rapid rise in temperature and voltage, or from a quick electromagnetic force change in the magnet, is thereby prevented. A number of quench systems for protection of superconducting magnets are known. For example, U.S. Pat. No. 6,147,844 to Huang et al, U.S. Pat. No. 5,739,997 to Gross, and U.S. Pat. Nos. 5,650,903 and 5,731,939 to Gross et al. relate to quench protection circuits for superconducting magnets.

An actively shielded MRI magnet consists of main coils and shielding coils (also herein referred to as bucking coils). The main and shielding coils produce a homogeneous field in the image volume and reduce fringe fields. Most of the superconducting MRI magnets are made of coils that are symmetric with respect to a symmetry mid-plane. During a quench, the current in different coils may not decay at exactly the same rate. A net differential force acting on the coils and coil supporting structure could thereby be induced. The net differential force in the right and left halves of the magnets and/or between the main coil and the bucking coil structures results in an unbalanced quench. An unbalanced quench could potentially damage coil supporting structures, and thermal shields depending on the severity of the unbalance.

Due to the exact same reason that the current in different coils may not decay at exactly the same rate, the shielding magnetic field produced by the bucking coil(s), and the main magnetic field produced by the main coil(s) may not be canceling each other exactly, resulting in a temporary fringe field blooming, which is a phenomenon where the static fringe field lines, such as a 0.5 mT line, extends temporarily beyond the normal operation limit. Fringe field blooming is undesirable.

BRIEF DESCRIPTION OF THE INVENTION

In one aspect, a method of fabricating an imaging system including a plurality of coil groups is provided. The method includes connecting at least one first diode between terminals of a first coil group, connecting at least one second diode between terminals of a second coil group, wherein the second group is connected to the first coil group via a separation line, and connecting at least one quench heater between the separation line and the first and second diodes.

In another aspect, a method for adjusting energy input to a quench heater is provided. The method includes connecting at least one diode in series with the quench heater and in parallel with at least one coil, and connecting at least one shunt resistor in series with the diode to adjust energy input to the quench heater.

In still another aspect, a method for adjusting a current flowing through a coil separation line separating at least one coil group from another coil group is provided. The method includes connecting at least one quench heater to the coil separation line in parallel at least one coil group, and connecting at least one shunt resistor in parallel to the quench heater to adjust the current flowing through the coil separation line.

In yet another aspect, a quench protection circuit includes a first coil group, a second coil group, and a coil separation line connecting the first group to the second group. The circuit also includes a first quench heater connected to the coil separation line; and a first diode in series with the first quench heater such that the first diode and the first quench heater are parallel at least one of the first coil group and the second coil group.

In another aspect, a magnetic resonance imaging (MRI) system includes a radio frequency (RF) coil assembly and a gradient coil assembly for imaging a subject volume, a computer coupled to the RF and the gradient coils, wherein the computer is configured to generate images of a scanned object, and a magnetic resonance imaging magnet is protected by a quench protection circuit. The quench protection system includes a first coil group, a second coil group, and a coil separation line connecting the first group to the second group. The circuit also includes a first quench heater connected to the coil separation line; and a first diode in series with the first quench heater such that the first diode and the first quench heater are parallel at least one of the first coil group and the second coil group.

In yet another aspect a method of protecting an MR imaging magnet including a plurality of coil groups is provided. The method includes providing a quench protection circuit configured such that the coil groups have a substantial zero eddy current time constant.

In still another aspect, a method of protecting an MR imaging magnet including a plurality of coil groups is provided wherein the method includes providing a quench protection circuit configured such that the coil groups have substantially no unbalanced quench forces during quench events.

In still another aspect, a method in connecting the coils to achieve above mentioned characteristics includes the following steps no two mirroring coils are separately connected into two different quench protection loops, bucking coils or part of the bucking coils must be grouped along with the main coils, bucking or main coils may be subdivided into several sub-coils to achieve minimum fringe field blooming.

DETAILED DESCRIPTION OF THE INVENTION

Herein described are methods and apparatus which allow for a more even quenching of a plurality of coils in a multi coil application in which a quench is started in one coil.

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features. Additionally, as is known in the art, a reference to a main coil contemplates a plurality of coils, and therefore the terms main coil and main coils are used interchangeably herein. For the same reason, the terms shield (or bucking) coil and shield (or bucking) coils are also interchangeable herein.

Figure 1:
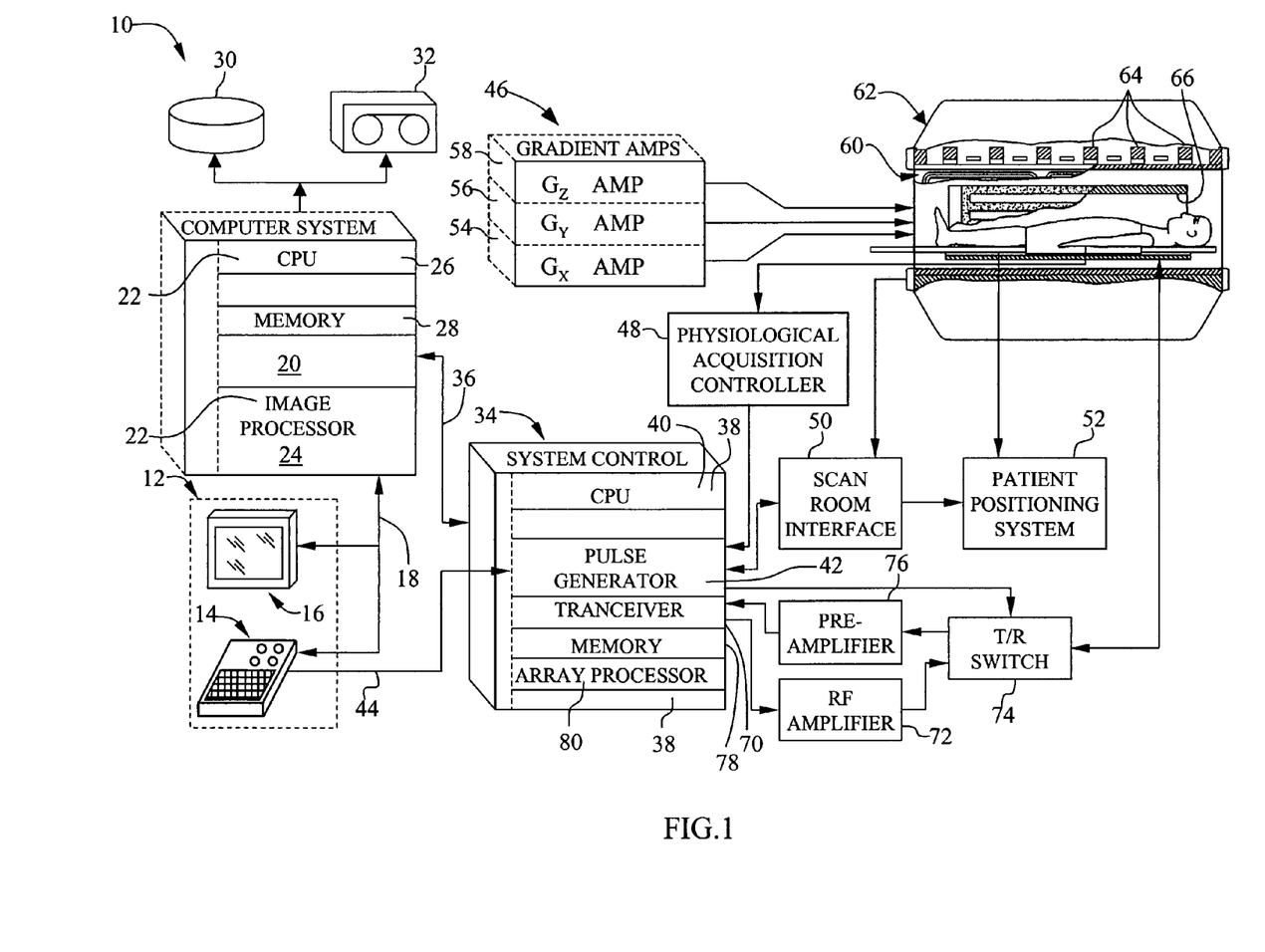
FIG. 1 is a block schematic diagram of a Magnetic Resonance Imaging (MRI) system.

FIG. 1 is a block diagram of an embodiment of a magnetic resonance imaging (MRI) system 10 in which the herein described systems and methods are implemented. MRI 10 includes an operator console 12 which includes a keyboard and control panel 14 and a display 16. Operator console 12 communicates through a link 18 with a separate computer system 20 thereby enabling an operator to control the production and display of images on screen 16. Computer system 20 includes a plurality of modules 22 which communicate with each other through a backplane. In the exemplary embodiment, modules 22 include an image processor module 24, a CPU module 26 and a memory module 28, also referred to herein as a frame buffer for storing image data arrays. Computer system 20 is linked to a disk storage 30 and a tape drive 32 to facilitate storing image data and programs. Computer system 20 communicates with a separate system control 34 through a high speed serial link 36.

System control 34 includes a plurality of modules 38 electrically coupled using a backplane (not shown). In the exemplary embodiment, modules 38 include a CPU module 40 and a pulse generator module 42 that is electrically coupled to operator console 12 using a serial link 44. Link 44 facilitates transmitting and receiving commands between operator console 12 and system command 34 thereby allowing the operator to input a scan sequence that MRI system 10 is to perform. Pulse generator module 42 operates the system components to carry out the desired scan sequence, and generates data which indicative of the timing, strength and shape of the RF pulses which are to be produced, and the timing of and length of a data acquisition window. Pulse generator module 42 is electrically coupled to a gradient amplifier system 46 and provides gradient amplifier system 46 with a signal indicative of the timing and shape of the gradient pulses to be produced during the scan. Pulse generator module 42 is also configured to receive patient data from a physiological acquisition controller 48. In the exemplary embodiment, an optional physiological acquisition controller 48 is configured to receive inputs from a plurality of sensors indicative of a patients physiological condition such as, but not limited to, ECG signals from electrodes attached to the patient. Pulse generator module 42 is electrically coupled to a scan room interface circuit 50 which is configured to receive signals from various sensors indicative of the patient condition and the magnet system. Scan room interface circuit 50 is also configured to transmit command signals such as, but not limited to, a command signal to move the patient to a desired position, to a patient positioning system 52.

The gradient waveforms produced by pulse generator module 42 are input to gradient amplifier system 46 that includes a $G_x$ amplifier 54, a $G_y$ amplifier 56, and a $G_z$ amplifier 58. Amplifiers 54, 56, and 58 each excite a corresponding gradient coil in gradient coil assembly 60 to generate a plurality of magnetic field gradients used for position encoding acquired signals. In the exemplary embodiment, gradient coil assembly 60 includes a magnet assembly 62 that includes a polarizing magnet 64 and an RF coil 66. Coil 66 can be a whole body coil, a head coil or any RF coil.

In use, a transceiver module 70 positioned in system control 34 generates a plurality of electrical pulses which are amplified by an RF amplifier 72 that is electrically coupled to RF coil 66 using a transmit/receive switch 74. The resulting signals radiated by the excited nuclei in the patient are sensed by RF coil 66 and transmitted to a preamplifier 76 through transmit/receive switch 74. The amplified NMR (nuclear magnetic resonance) signals are then demodulated, filtered, and digitized in a receiver section of transceiver 70. Transmit/receive switch 74 is controlled by a signal from pulse generator module 42 to electrically connect RF amplifier 72 to coil 66 during the transmit mode and to connect preamplifier 76 during the receive mode. Transmit/receive switch 74 also enables a separate RF coil (for example, a surface coil) to be used in either transmit or receive mode.

The NMR signals received by RF coil 66 are digitized by transceiver module 70 and transferred to a memory module 78 in system control 34. When the scan is completed and an array of raw k-space data has been acquired in the memory module 78. The raw k-space data is rearranged into separate k-space data arrays for each image to be reconstructed, and each of these is input to an array processor 80 configured to Fourier transform the data into an array of image data. This image data is transmitted through serial link 36 to computer system 20 where it is stored in disk memory 30. In response to commands received from operator console 12, this image data may be archived on tape drive 32, or it may be further processed by image processor 24 and transmitted to operator console 12 and presented on display 16.

Figure 2:
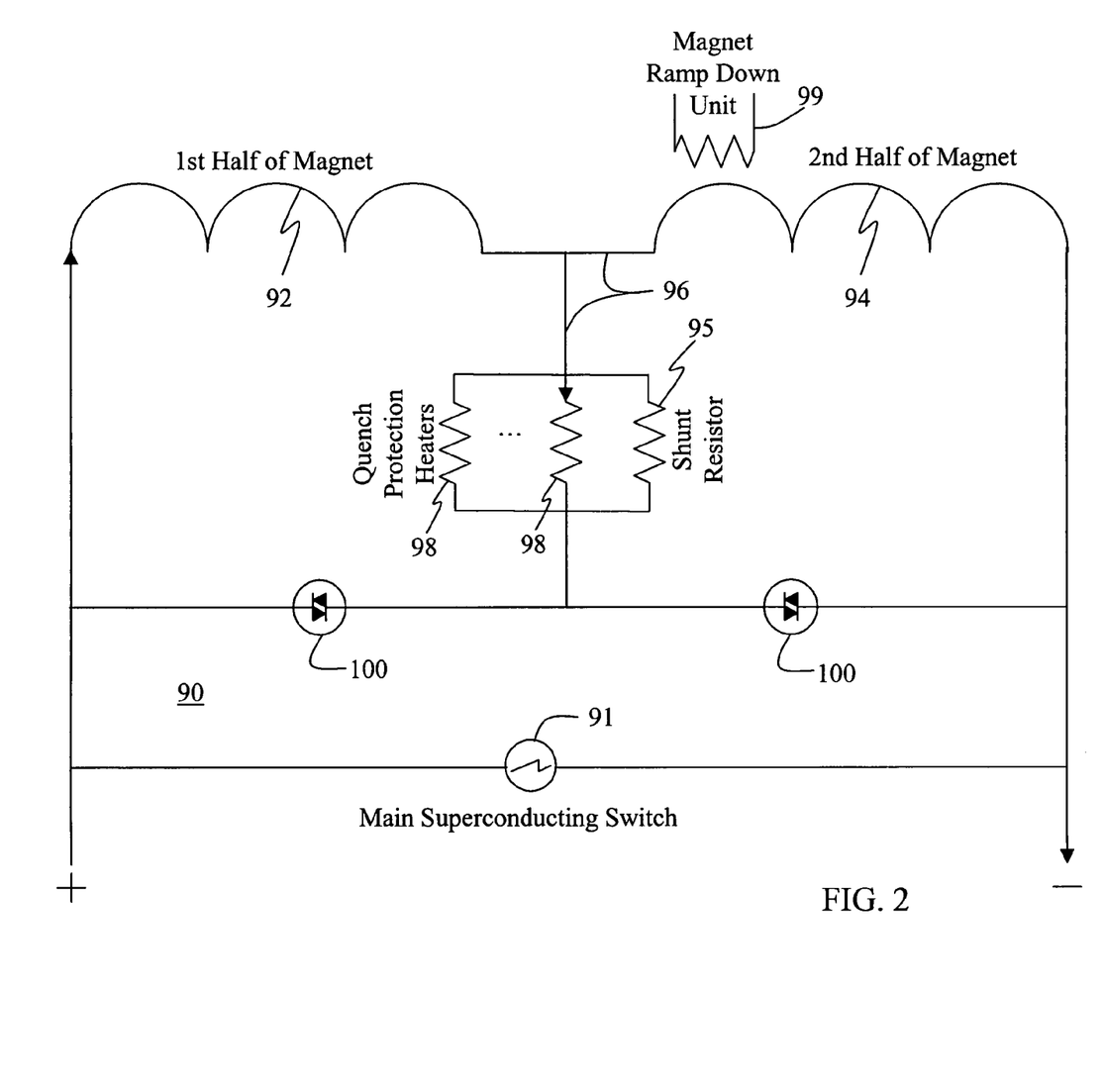
FIG. 2 illustrates a quench protection circuit.

FIG. 2 illustrates a quench protection circuit 90 including a superconducting switch 91, a first coil group 92, and a second coil group 94 connected to first coil group 92 by a separation line 96. Connected to separation line 96 are a plurality of quench heaters 98. Although two quench heaters 98 are illustrated in FIG. 2, it is contemplated that the benefits of the invention accrue to circuits 90 with only one quench heater and circuits 90 with more than two quench heaters. A plurality of diodes 100 couple each quench heater 90 to a respective terminal of first and second coil groups 92 and 94. Each coil group 92 and 94 may be a single coil or may be a plurality of coils. In an exemplary embodiment, no mirror coils on both sides of the magnet mid plane are separated into different groups, and the bucking (or shielding) coils (or portions of them) are in the same group as the large main magnet coils or portions of them. In other words, the symmetry is preserved and at least a portion of the main coils is grouped with at least a portion of the shielding coils to reduce or eliminate field fringe bloom during a quench. For example, in one embodiment, the field fringe bloom is small in that it is less than one-half of a meter.

As illustrated in FIG. 2, at least one diode 100 is connected across the terminals of each coil group 92 and 94. In an exemplary embodiment, a pair of polarity opposite [back to back] diodes 100 are connected across the terminals of each coil group 92 and 94. Quench heaters 98 are connected to the two group separation line 96 between the connection point of diodes 100 and the connection point of the two groups (92 and 94) of magnet coils. In an exemplary embodiment, a magnet ramp down unit 99 is provided.

Figure 3:
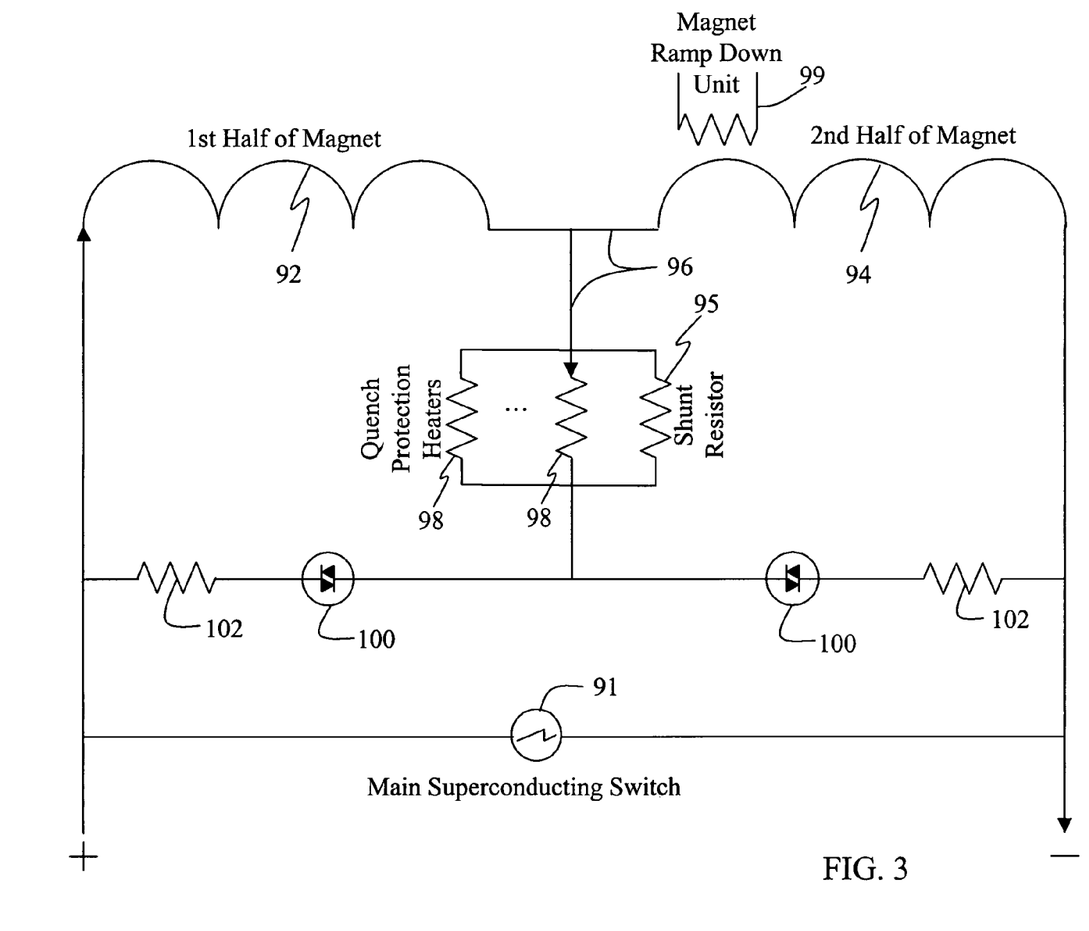
FIG. 3 illustrates the quench protection circuit shown in FIG. 2 with shunt resistors.

A shunt resistor 95 may be connected in parallel to the above mentioned quench heaters 98 in order to achieve a desired resistance value to adjust for a proper imbalance current flowing through middle separation line 96. Additionally, a dump resistor 102 may be connected in series with one of the diodes 100 or both of them to adjust energy input to the quench heaters as shown in FIG. 3. Although, FIG. 3 illustrates one dump resistor 102 for each coil group 92 and 94, in other embodiments, at least one coil group does not have a dump resistor in series with diode 100.

During normal operation of system 10, electricity flows from switch 91 to first coil group 92, through separation line 96, and then through second coil group 94 before returning to switch 91. During normal operation, because first coil group 92 is superconductive, there is no or little voltage across the diode 100 connected across the terminals of first coil group 92. However, if a quench occurs in any portion of first coil group 92, then a voltage is produced across diode 100. As soon as the voltage across diode 100 reaches its triggering voltage, diode 100 become conductive and current is provided to quench heater 98 which simultaneously quenches all the coils in both coil groups. Shortly thereafter, as second coil group 94 quench progresses, diode 100 between the terminals of second coil group 94 also becomes conductive when the voltage across the diode reaches its triggering voltage. Additionally, magnet ramp down unit 99 can be utilized to achieve a quick ramp down in emergency circumstances. In use, and when an operator whishes to quickly ramp down the coils, the operator triggers magnet ramp down unit 99 to cause a quench in second coil group 94, which causes a simultaneous quench of all coils as explained immediately above with respect to the initial quench occurring in first coil group 92. Although illustrated with magnet ramp down unit 99 positioned to quench second coil group 94, unit 99 may be positioned to quench any coil group.

Figure 4:
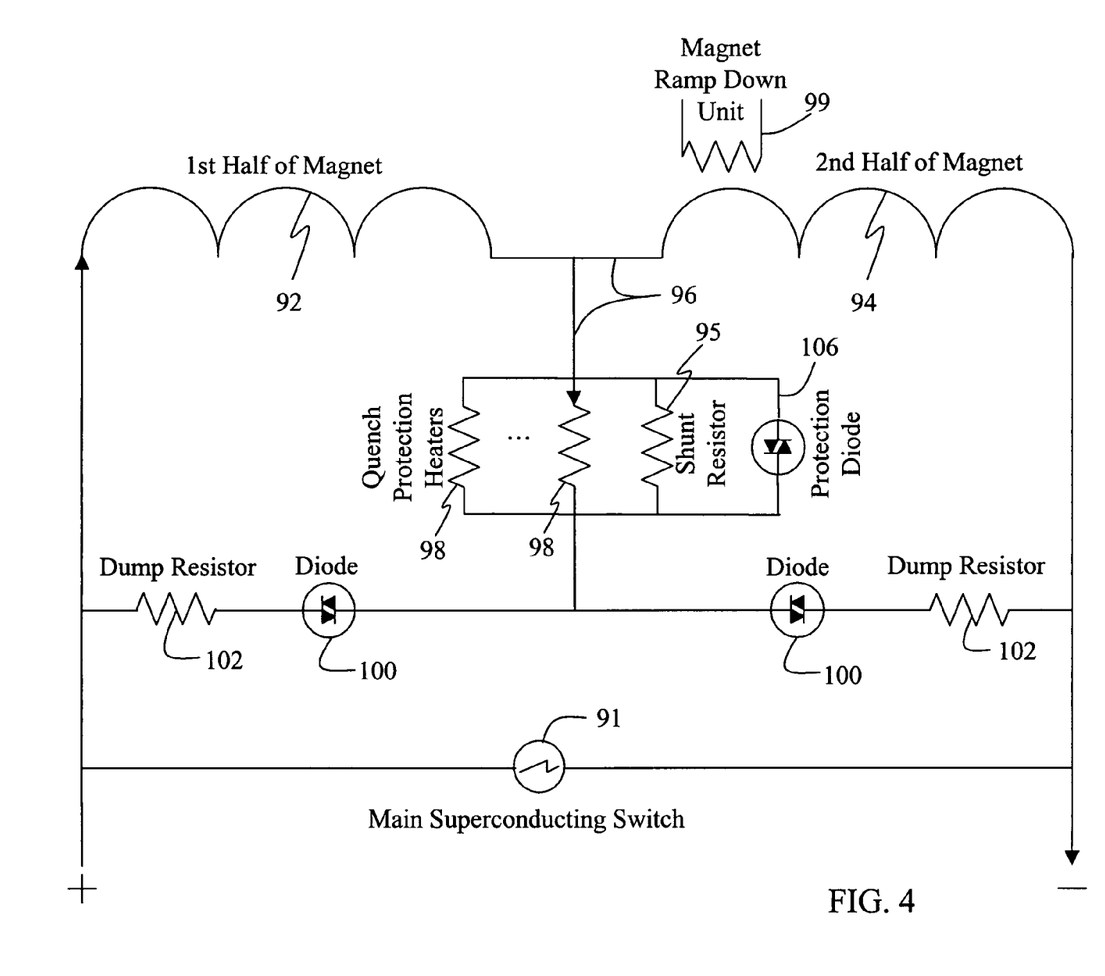
FIG. 4 illustrates the quench protection circuit shown in FIG. 3 with a protection diode.

FIG. 4 includes a protection diode 106 that, in one embodiment, protects heaters 98 by providing a closed circuit parallel heaters 98 when the voltage across heaters 98 is at least equal to the breakdown voltage of diode 106. Typically, diode 106 is used in conjunction with low voltage quench heaters which burn up easily.

Technical effects of circuit 90 include actively detecting quenches occurring anywhere in the coil system and protecting the magnet from damage during a quench, having a zero eddy current time constant enabling high patient throughput, having no or little unbalanced forces and fringe field blooming during quenches, allowing an early detection of any quench originated in any coils including the small coils, and having a low hotspot temperature during a quench. Additionally, circuit 90 provides for having no or less helium boil off from associated with quench protection components during magnet ramping, has no adverse impact on ramping (magnet can be ramp with high voltage as long as it does not quench the magnet), and circuit 90 provides quench protection at a low cost.

While the invention has been described in terms of various specific embodiments, those skilled in the art will recognize that the invention can be practiced with modification within the spirit and scope of the claims.

What is claimed is:

1. A method of protecting an MR imaging magnet including a plurality of coil groups, said method comprising:
   connecting at least one first diode between terminals of a first coil group;
   connecting at least one second diode between terminals of a second coil group, wherein the second group is connected to the first coil group via a separation line; and
   connecting at least one quench heater directly with the separation line and with the first and second diodes, wherein a voltage across the first coil group is at least equal to a sum of voltages across the at least one first diode and the at least one quench heater, and wherein an amount of current flowing through the at least one quench heater is different than an amount of current flowing through the at least one first diode.

2. A method in accordance with claim 1 wherein said connecting at least one first diode between terminals of a first coil group comprises connecting at least one first diode between terminals of a first coil group, wherein the first coil group comprises at least a portion of a main coil and at least a portion of a shielding coil.

3. A method in accordance with claim 1 further comprising connecting at least one dump resistor in series with the first diode .

4. A method in accordance with claim 1 further comprising connecting at least one dump resistor in series with the second diode.

5. A method in accordance with claim 4 further comprising connecting at least one shunt resistor in parallel with the quench heater.

6. A method in accordance with claim 4 further comprising connecting at least one protecting diode in parallel with the quench heater.

7. A method in accordance with claim 1 further comprising connecting at least one shunt resistor in parallel with the quench heater.

8. A method in accordance with claim 1 further comprising connecting at least one protecting diode in parallel with the quench heater.

9. A method in accordance with claim 1, wherein said connecting at least one first diode between terminals of a first coil group comprises connecting at least two first diodes between terminals of the first coil group such that one first diode is positioned with a polarity opposite a polarity of another first diode, wherein said connecting at least one second diode between terminals of a second coil group comprises connecting at least two second diodes between terminals of the second coil group such that one second diode is positioned with a polarity opposite a polarity of another second diode.

10. A method in a accordance with claim 1 wherein the first and second coil groups have a substantial zero eddy current time constant.

11. A method in accordance with claim 1 wherein the first and second coil groups have substantially small fringe field blooming during quench events.

12. A method for adjusting energy input to a quench heater, said method comprising:
    connecting at least one diode in series with dump resistor; and
    connecting a quench heater, the at least one diode, and the dump resistor in parallel with a coil group of a magnetic resonance imaging system, wherein a voltage across the coil group is equal to a sum of voltages across the quench heater, the at least one diode, and the dump resistor.

13. A method for adjusting a current flowing through a coil quench heater, said method comprising:
    connecting at least one quench heater directly to a coil separation line separating a first coil group from a second coil group;
    connecting at least one shunt resistor or protecting diode in parallel to the quench heater to adjust the current flowing through the coil quench heater; and
    connecting a quench protection diode and the at least one quench heater in parallel with the first coil group, wherein a voltage across the first coil group is equal to a sum of voltages across the quench protection diode and the at least one quench heater, and wherein an amount of current flowing through the at least one quench heater is different than an amount of current flowing through the quench protection diode.

14. A quench protection circuit comprising:
    a first coil group;
    a second coil group;
    a coil separation line connecting said first group to said second group;
    a first quench heater directly connected to said coil separation line; and
    a first diode and said first quench heater are coupled in parallel with said first coil group, wherein a voltage across the first coil group is equal to a sum of voltages across the first diode and the first quench heater, and wherein an amount of current flowing through the first quench heater is different than an amount of current flowing through the first diode.

15. A circuit in accordance with claim 14 further comprising a second diode coupled with said first quench heater such that said second diode and said quench heater are parallel to said second coil group, wherein said second diode is positioned with a polarity opposite a polarity of said first diode.

16. A circuit in accordance with claim 15 further comprising:
    a second quench heater connected to said coil separation line, and
    a third diode coupled to said second quench heater such that said third diode and said second quench heater are parallel said second coil group.

17. A circuit in accordance with claim 16 further comprising at least one shunt resistor connected to said coil separation line in parallel to said first quench heater and said second quench heater.

18. A circuit in accordance with claim 17 wherein the first coil group comprises at least a portion of a main coil and at least a portion of a shielding coil.

19. A circuit in accordance with claim 14 wherein the first coil group comprises at least a portion of a main coil and at least a portion of a shielding coil.

20. A circuit in accordance with claim 19 further comprising:
    a second quench heater connected to said coil separation line, and
    a second diode coupled with said second quench heater such that said second diode and said second quench heater are parallel said second coil group.

21. A circuit in accordance with claim 14 further comprising:
    a second quench heater connected to said coil separation line, and
    a second diode coupled with said second quench heater such that said second diode and said second quench heater are parallel said second coil group.

22. A circuit in accordance with claim 21 further comprising a third diode coupled with said second quench heater such that said third diode and said second quench heater are parallel said second coil group, wherein said second diode is parallel said first diode and positioned with a polarity opposite a polarity of said first diode.

23. A circuit in accordance with claim 14 further comprising:
    a shunt resistor positioned in parallel to the first quench heater to adjust the current flowing through the quench heater.

24. A magnetic resonance imaging (MRI) system comprising:
    a radio frequency (RF) coil assembly for imaging a subject volume;
    a computer coupled to said RE coil, said computer configured to generate images of a scanned object; and
    a magnetic resonance imaging magnet having a quench protection circuit, said quench protection system comprising:
    a first coil group;
    a second coil group;
    a coil separation line connecting said first group to said second group;
    a first quench heater directly connected to said coil separation line; and
    a first diode and said first quench heater are coupled in parallel with said first coil group, wherein a voltage across the first coil group is equal to a sum of voltages across the first diode and the first quench heater, and wherein an amount of current flowing through the first quench heater is different than an amount of current flowing through the first diode.

25. A method of protecting an MR imaging magnet including a plurality of coil groups including a first coil group and a second coil group, said method comprising:
   connecting a first diode with the first coil group;
   connecting the second coil group with the first coil group via a separation line; and
   connecting a quench heater directly with the separation line and with the first diode, wherein a voltage across the first coil group is equal to a sum of voltages across the first diode and the quench heater, and wherein an amount of current flowing through the quench heater is different than an amount of current flowing through the first diode, and wherein the first and second coil groups have substantially no unbalanced quench forces during quench events.

* * * * *

UNITED STATES PATENT AND TRADEMARK OFFICE
CERTIFICATE OF CORRECTION

| | |
|---|---|
| PATENT NO. | : 7,116,535 B2 |
| APPLICATION NO. | : 10/826643 |
| DATED | : October 3, 2006 |
| INVENTOR(S) | : Huang |

Page 1 of 1

It is certified that error appears in the above-identified patent and that said Letters Patent is hereby corrected as shown below:

In Claim 10, column 7, line 24, delete "in a accordance" and insert therefor -- in accordance --.
      In Claim 12, column 7, line 32, between "with" and "dump" insert -- a --.
      In Claim 22, column 8, beginning on line 43, delete "diode is parallel said first diode and positioned" and insert therefor -- diode is positioned --.
      In Claim 24, column 8, line 55, delete "said RE coil," and insert therefor -- said RF coil, --.

Signed and Sealed this

Third Day of June, 2008

JON W. DUDAS
*Director of the United States Patent and Trademark Office*